United States Patent [19]
Ott et al.

[11] Patent Number: 5,278,138
[45] Date of Patent: Jan. 11, 1994

[54] AEROSOL CHEMICAL VAPOR DEPOSITION OF METAL OXIDE FILMS

[76] Inventors: Kevin C. Ott, 4745 Trinity Dr., Los Alamos, N. Mex. 87544; Toivo T. Kodas, 5200 Noreen Dr. NE., Albuquerque, N. Mex. 87111

[21] Appl. No.: 774,748

[22] Filed: Oct. 11, 1991

Related U.S. Application Data

[63] Continuation of Ser. No. 509,120, Apr. 16, 1990, abandoned.

[51] Int. Cl.$^5$ .......................... C23C 16/00; B05D 5/12
[52] U.S. Cl. .......................................... 505/1; 505/734; 505/737; 505/742; 427/62; 427/126.3; 427/255.3; 427/255.2; 427/255.1; 427/314
[58] Field of Search .................. 505/1, 734, 737, 742; 427/62, 63, 314, 126.3, 255.3, 255.2, 255.1

[56] References Cited

U.S. PATENT DOCUMENTS 4,571,350  2/1986  Parker et al. ...................... 427/109

FOREIGN PATENT DOCUMENTS

WO89/07667  8/1989

OTHER PUBLICATIONS

DeSisto et al. in Mat. Res. Bull., vol. 24 pp. 753–760 (1989) entitled "Preparation and Characterization of Copper(II) Oxide Thin Films Grown by a Novel Spray Pyrolysis Method".

Lambeck et al. in "Sensors & Actuators", edited by J. C. Lodder, pp. 85–95 (1986), entitled Thin Layer Formation by Chemical Aerosol Deposition.

Kodas et al., in Appl. Phys. Lett. vol. 52, pp. 1622–1624, May 9, 1988, entitled Aerosol Flow Reactor Production of Fine Y$_1$Ba$_2$Cu$_3$O$_7$ Powder; Fabrication of Superconducting Ceramics.

Pebler et al. in Mat. Res. Bull., vol. 23, pp. 1337–1344 (1988), entitled Synthesis of Small Particle Size YBa$_2$Cu$_3$O$_{7-x}$ By a Vapor Phase Process.

Chu et al. in J. Appl. Phys vol. 64, pp. 2523–2526 (Sep. 1988), entitled Epitaxial Growth of High T$_c$ superconducting Y—Ba—Cu—O Thin Films on (001)MgO by a Chemical Spray Pyrolysis Method.

Cooper et al. in Materials Letters, vol. 7, pp. 5–8 (Aug. 1988), entitled Bismuth Strontium Copper Oxide High-T$_c$ Superconducting Films From Nitrate Precursors.

Kawai et al. in Japanese J. of App. Phys., vol. 26, pp. L1740–L1742 (Oct. 1987), entitled Formation of Y—Ba—Cu—O Superconducting Film by a Spray Pyrolysis Method.

(List continued on next page.)

*Primary Examiner*—Roy King
*Attorney, Agent, or Firm*—Bruce H. Cottrell; Paul D. Gaetjens; William R. Moser

[57] ABSTRACT

A process of preparing a film of a multicomponent metal oxide including: forming an aerosol from a solution comprised of a suitable solvent and at least two precursor compounds capable of volatilizing at temperatures lower than the decomposition temperature of said precursor compounds; passing said aerosol in combination with a suitable oxygen-containing carrier gas into a heated zone, said heated zone having a temperature sufficient to evaporate the solvent and volatilize said precursor compounds; and passing said volatilized precursor compounds against the surface of a substrate, said substrate having a sufficient temperature to decompose said volatilized precursor compounds whereby metal atoms contained within said volatilized precursor compounds are deposited as a metal oxide film upon the substrate is disclosed. In addition, a coated article comprising a multicomponent metal oxide film conforming to the surface of a substrate selected from the group consisting of silicon, magnesium oxide, yttrium-stabilized zirconium oxide, sapphire, or lanthanum gallate, said multicomponent metal oxide film characterized as having a substantially uniform thickness upon said substrate, and as having a crystalline orientation defined as predominantly C-axis oriented by x-ray diffraction is disclosed.

10 Claims, No Drawings

OTHER PUBLICATIONS

Ottosson et al. in Appl. Phys. Lett., vol. 54, pp. 2476–2478 (Jun. 1989), entitled Chemical Vapor Deposition of the Superconducting $YBa_2Cu_{37-x}$ Phase Using Halides as Metal Sources.

Landet et al, "High $T_c$ superconducting films prepared by pyrolysis of an ultrasonic-generated aerosol," Journal of the Less-Common Metals V151PT2 May 1989 pp. 399–406.

Yamada et al., Funtai Oyobi Funmatsuyarin (Japan) v. 35:9, Dec. 1988 pp. 55–58.

Kodas et al., "Generation of thick $Ba_2YCu_3O_7$ films by aerosol deposition", Appl. Phys. lett. 54(19) May 1989 pp. 1923–1925.

Nasu et al., "$Ba_2YCu_3O_x$ Films prepared by pyrolysis of organic or inorganic acid salts", MRS Symposium Support (Nevada) Apr. 1988 pp. 101–104.

"Laser-induced Deposition of superconducting materials by thermal decomposition of organometallic films", Research Disclosure, Dec. 1988, Number 296.

5,278,138

AEROSOL CHEMICAL VAPOR DEPOSITION OF METAL OXIDE FILMS

FIELD OF THE INVENTION

The present invention relates to the field of film coating deposition techniques, and more particularly to the deposition of multicomponent metal oxide films by aerosol chemical vapor deposition. This invention is the result of a contract with the Department of Energy (Contract No. W-7405-ENG-36).

This is a continuation of U.S. application Ser. No. 07/509,120 filed Apr. 16, 1990, now abandoned.

BACKGROUND OF THE INVENTION

Much recent effort has been directed towards the development of economically viable methods for fabricating films of metal oxides and particularly films of multicomponent metal oxides, i.e., metal oxides containing more than one type of metal in the chemical composition of the film. Among the various methods employed are physical-based vapor deposition methods such as laser ablation or evaporation, of magnetron sputtering, and electron beam evaporation, chemical-based vapor deposition methods such as spray pyrolysis, and conventional chemical vapor deposition.

The properties of the multicomponent metal oxide films preferably include a highly smooth mirror-like surface, a uniform or consistent chemical composition or stoichiometry, a conformal deposition, i.e., a uniform coating thickness upon either a planar or a non-planar substrate surface, and a crystallographic orientation upon the substrate. Also, the method of depositing such multicomponent metal oxide films preferably has a high rate of deposition.

Each of the presently available deposition methods has drawbacks that limit the usefulness of the particular method in deposition of multicomponent metal oxide films. For example, laser evaporation, rf magnetron sputtering, and spray pyrolysis do not produce a highly smooth mirror-like surface on non-planar substrates. Conventional chemical vapor deposition utilizes a number of precursor compounds that can volatilize and decompose at different rates and therefore does not produce a uniform composition. Rf magnetron sputtering and electron beam evaporation do not produce consistent film compositions. Further, none of the physical-based vapor deposition methods can typically achieve conformal coatings on non-planar surfaces as such methods are generally limited to line-of-sight deposition.

Accordingly, one object of this invention is to provide a process of depositing a film of a multicomponent metal oxide having a highly smooth mirror-like surface.

A further object of this invention is to provide a process of depositing a film of a multicomponent metal oxide having a consistent chemical composition or stoichiometry.

Yet another object of this invention is to provide a process of depositing a conformal film or coating of a multicomponent metal oxide onto either a planar or a non-planar substrate.

SUMMARY OF THE INVENTION

To achieve the foregoing and other objects, and in accordance with the purposes of the present invention, as embodied and broadly described herein, the present invention provides a process of preparing a film of a multicomponent metal oxide including: (a) forming an aerosol from a solution comprised of a suitable solvent and at least two precursor compounds capable of volatilizing at temperatures lower than the decomposition temperatures of said precursor compounds; (b) passing said aerosol in combination with a suitable oxygen-containing carrier gas into a heated zone, said heated zone having a temperature sufficient to evaporate the solvent and volatilize said precursor compounds; and (c) passing said volatilized precursor compounds in contact with a surface of a heated substrate, said substrate heated at temperatures sufficient to decompose said volatilized precursor compounds whereby metal atoms contained within said volatilized precursor compounds are deposited as a multicomponent metal oxide film upon the substrate.

The present invention further provides a process of preparing a film of a high temperature superconductive metal oxide including: (a) forming an aerosol from a solution comprised of a suitable solvent and suitable superconductive composition precursor compounds including, e.g., a barium compound, a copper compound, and a yttrium compound, said precursor compounds capable of volatilizing at temperatures lower than the decomposition temperatures of said precursor compounds; (b) passing said aerosol in combination with a suitable oxygen-containing carrier gas into a heated zone, said heated zone having a temperature sufficient to evaporate the solvent and volatilize said precursor compounds; (c) passing said volatilized precursor compounds against a surface of a heated substrate, said substrate heated at temperatures sufficient to decompose said volatilized precursor compounds whereby metal atoms contained within said volatilized precursor compounds are deposited as a multicomponent superconductive metal oxide film upon the substrate; and, (d) heating said deposited multicomponent metal oxide film in an oxygen-containing atmosphere at temperatures sufficient to form said high temperature superconductive metal oxide film.

The present invention still further provides a process of preparing in situ a film of a high temperature superconductive metal oxide including: (a) forming an aerosol from a solution comprised of a suitable solvent and suitable superconductive composition precursor compounds including, e.g., a barium compound, a copper compound, and a yttrium compound, said precursor compounds capable of volatilizing at temperatures lower than the decomposition temperatures of said precursor compounds; (b) passing said aerosol in combination with a suitable oxygen-containing carrier gas into a heated zone, said heated zone having a temperature sufficient to evaporate the solvent and volatilize said precursor compounds; (c) passing said volatilized precursor compounds against a surface of a heated substrate, said substrate heated at temperatures sufficient to decompose said volatilized precursor compounds whereby metal atoms contained within said volatilized precursor compounds are deposited in situ as a multicomponent superconductive metal oxide film upon the substrate.

The present invention also provides a coated article including a multicomponent metal oxide film conforming to the surface of a substrate selected from the group consisting of silicon, magnesium oxide, yttrium-stabilized zirconium oxide, sapphire, lanthanum aluminate, or lanthanum gallate, said multicomponent metal oxide film characterized as having a substantially uniform thickness upon said substrate, and as having a crystalline orientation defined by x-ray diffraction (XRD) as predominantly C-axis oriented.

DETAILED DESCRIPTION

The present invention concerns a process of preparing a film of a multicomponent metal oxide. Such a process is capable of preparing films having a highly smooth mirror-like surface, capable of preparing films having a consistent chemical composition or stoichiometry, and capable of preparing films having complex non-planar conformations. Such a process may be capable of depositing such films at a high rate.

By "multicomponent" metal oxide it is meant that the metal oxide contains more than one type of metal in the particular composition. Among the multicomponent metal oxide compounds that may be deposited by the process are high temperature superconductive compounds such as the rare earth metal-alkaline earth metal-copper oxides, e.g., (a) yttrium-barium-copper oxides ($YBa_2Cu_3O_{7-x}$) wherein the yttrium can be replaced, e.g., by lanthanum, scandium, cerium, gadolinium, holmium, erbium, thulium, ytterbium, lutetium, dysprosium, samarium, neodymium or europium, (b) lanthanum-strontium-copper oxides, or (c) yttrium-calcium-barium-copper oxides ($Y_{1-x}Ca_xBa_2Cu_4O_8$), or other superconductive oxides such as bismuth-calcium-strontium-copper oxides ($Bi_2Ca_{n-1}Sr_2Cu_nO_{2n+4}$), thallium-calcium-barium-copper oxides ($Tl_2Ca_{n-1}Ba_2Cu_nO_{2n+4}$), or lead-bismuth-strontium-calcium-copper oxides and variations of these materials. Other multicomponent metal oxide compounds such as ferrites, i.e., barium ferrites such as $BaFe_{12}O_{19}$, yttrium ferrites such as $Y_3Fe_5O_{12}$, or a complex ferrite such as $BaZn_{2-x}Co_xFe_{16}O_{27}$, titanantes, e.g., $PbZr_{1-x}Ti_xO_3$, or niobates may also be deposited by this process.

In the present process, an aerosol is formed from a solution comprised of a suitable solvent and at least two precursor compounds capable of volatilizing at temperatures lower than the decomposition temperatures of said precursor compounds. By use of an aerosol, control of subsequent film composition can be more readily controlled since solution composition, aerosol droplet composition and vaporization rates of the precursor compounds remain constant over time. Suitable solvents should be capable of solubilizing the desired precursor compounds and of readily volatilizing at temperatures below the temperature of the substrate, and such solvents include common organic solvents such as alcohols, ketones and aromatics. The suitable solvents can be further characterized as non-reactive with both the precursor compounds and the substrate. Optionally, separate aerosols may be generated from separate solutions, each solution including a suitable solvent and one or more of the precursor compounds. The separate aerosols may then be simultaneously fed to the heated zone.

By "aerosol" it is meant that the solution is converted to a suspension of essentially spherical liquid particles or droplets having diameters of from about 0.1 to about 10.0 microns.

After formation of the aerosol, the aerosol is passed or carried into a heated zone by a carrier gas. The carrier gas can be selected from the group consisting of inert gases such as argon, helium or nitrogen, and mixtures including a major component of one or more inert gases and a minor component of oxygen. Preferably, the carrier gas is a mixture including a major component of one or more inert gases and a minor component of oxygen. An especially preferred carrier gas is a mixture of from about 90 to about 99 percent by weight argon and from about 1 to about 10 percent by weight oxygen. While not wishing to be bound by the present explanation it is believed that by including a minor percentage of oxygen in the carrier gas, the process is aided in that the decomposition of the precursor compounds occurs more readily at the substrate surface, and the products of the decomposition are metal oxides. Further, it is believed that by addition of a minor amount of oxygen that carbon-containing ligands in the precursor compounds can be more readily converted to volatile carbon oxides thereby reducing the potential for carbon contamination in the metal oxide films.

The heated zone used in the process is at temperatures sufficient to vaporize the solvent in the aerosol particles. Further, the heated zone is at temperatures sufficient to volatilize the remaining solvent-free aerosol particles of precursor compounds but at temperatures beneath the decomposition of the precursor compounds. The heated zone can be, e.g., the volume within a cylindrical tube or other suitable containment device.

A substrate can be generally located about midstream within the heated zone. The substrate can be heated independently of the heated zone used to volatilize the precursor compounds, e.g., the substrate can be heated by contact with a heating block or element whereby the substrate temperature can be carefully controlled or the substrate can be heated by the heated gas flow impinging upon the substrate. The substrate is heated at temperatures sufficient to decompose the volatilized precursor compounds as they are passed in contact with the substrate thereby permitting the metal atoms contained within the volatilized precursor compounds to deposit directly thereon. The preferred temperature of the substrate may vary depending upon the selection of the type of substrate, e.g., in order to minimize chemical interaction of the film components with the substrate material.

Location of the substrate in the system affects the residence time of the precursor compounds in the heated zone. Residence time affects the extent of gas phase reactions in the aerosol and in the vapor states. The extent of such gas phase reactions can influence the composition and morphology of the deposited multicomponent metal oxide film.

The substrate is selected from the group consisting of silicon, magnesium oxide, sapphire, lanthanum aluminate, lanthanum gallate, strontium titanate, yttrium-stabilized zirconium oxide and other perovskites or metal oxides having appropriate properties such as lattice match, thermal expansion match or chemical inertness as apparent to those skilled in the art. The substrate can further be a metal such as stainless steel, copper, silver, gold, platinum, palladium, rhodium, iron, lead, tin, cadmium, titanium, tungsten, molybdenum, zirconium, hafnium, tantalum, niobium and alloys thereof wherein such metal is preferably coated with a material such as magnesium oxide or zirconium oxide. The preferred substrate will vary depending upon the intended application. For example, the substrate can be silver for RF cavity applications, or can be lanthanum aluminate for radio frequency circuitry due to its low dielectric properties.

The flow rate of the carrier gas and the aerosol through the system and the heating zone is from about 0.1 to about 50 liters per minute although the flow rate will typically be dependent upon the total volume of the reactor with the residence time of the aerosol in the heated zone being a critical factor.

The composition of the solution used in forming the aerosol is a critical factor in the present process. Selection of the solvent and control of the molar ratios of the precursor compounds can depend upon the various volatilization temperatures, decomposition temperatures, residence time in the reactor, reactor configuration, pressure of system, oxygen partial pressure, and the chemical nature of the precursor. For example, oxygen partial pressure may be generally reduced to slow gas phase reaction rates, the pressure of the system can be reduced from atmospheric to subatmospheric pressure via a partial vacuum to increase deposition rate by increasing the partial pressure of the precursor compounds, and the substrate temperature may be varied to modify the deposition rate, deposition mechanism, i.e., whether the particle or gas is depositing, and morphology of the film. Preferably, in the preparation of a high temperature superconductor of the well known 1-2-3 type stoichiometry, the molar ratios of the yttrium: barium: copper compounds in the solution are in the range of about 0.5–1.5: 1.5–12.0 : 1.5–4.5.

The precursor compounds of the multicomponent metal oxide should include the desired metal atoms in combination with ligand groups that result in the precursor compounds having a sufficient volatility or vapor pressure at the temperatures present in the heated zone of the reactor in the vicinity of the heated substrate. An advantage of the present aerosol process is that the precursor compounds do not have to be volatile at or near room temperature. Also, the precursors are subjected to high temperatures for a relatively brief time in comparison, e.g., to conventional CVD wherein the system must be hot for vaporization and transportation. Among suitable ligands for the precursor compounds may be included substituted diketones such as tetramethylheptanedione, acetylacetone, fluorinated acetylacetone derivatives, or the precursor compounds may be metal halides such as yttrium chloride, barium iodide or copper chloride, and metal acetates such as yttrium acetate, barium acetate or copper acetate. Substituted diketones such as tetramethylheptanedione or hexafluoroacetylacetone are preferred. When metal halides or fluorinated acetylacetone derivatives are used, an appropriate amount of water vapor must be present within the reactor system either during or after film deposition to convert these precursor materials into their respective oxides. Preferably, the ligands are substituted diketones.

Reactor systems that may be used in the present process include both hot-wall reactors and cold-wall reactors, as well as plasma and photon enhanced deposition reactors.

The films of multicomponent metal oxides that can be prepared by the present process may generally range in thickness from about 4 angstroms to about 100,000 angstroms (10 microns) while maintaining a highly smooth surface. However, while the thickness can be varied from film to film, the thickness of an individual film is generally substantially uniform upon the substrate. The multicomponent metal oxide film may be further characterized as having a smoothness defined as a RMS surface roughness of less than about 1000 angstroms, preferably less than about 500 angstroms, i.e., the peak to valley distance on the film, by profilometry, and as being essentially carbon free as determined by x-ray photoelectron spectroscopy (XPS).

The present invention is more particularly described in the following example which is intended as illustrative only, since numerous modifications and variations will be apparent to those skilled in the art.

EXAMPLE 1

Preparation of a film of yttrium-barium-copper oxide in an atomic ratio of Y:Ba:Cu of 1:2:3 was as follows. A solution containing precursor compounds of the film was prepared from 100 milliliters (ml) of toluene, 0.9 millimole (0.575 gram (g)) of yttrium tetramethylheptanedionate, 2.4 millimole (1.21 g) of barium tetramethylheptanedionate, and 2.5 millimole (1.08 g) of copper tetramethylheptanedionate. The solution was loaded into a vessel attached to an aerosol generator (Model 3076, available from TSI, Inc., St. Paul, MN). An oxygen/argon mixture including 7.5% by weight oxygen was passed through the aerosol generator at a flow rate of about 4 standard cubic feet per hour (scfh) whereby an aerosol of the solution was passed into a conventional hot wall chemical vapor deposition reactor heated to a temperature of 300° C. The reactor included a quartz tube having an internal diameter of 30 millimeters situated in a 12" long tube furnace. A target substrate of $LaAlO_3$ having a 1 square centimeter surface area was mounted onto a nickel heating fixture and placed within the annulus of the quartz tube at a location 1.0 inch upstream of the center of the furnace. The target substrate was heated by the nickel fixture held at 725° C. to yield a substrate temperature of about 600° C. After about 90 minutes of deposition, heating via the furnace and heating block was stopped and the substrate was cooled to room temperature over a period of several hours as an oxygen/argon mixture including 1% by weight oxygen was passed through the reactor. Then, the film-coated substrate was annealed by heating at 920° C. for about 30 minutes under the 1% oxygen/argon mixture, followed by maintaining the film-coated substrate at 920° C. for about an hour under pure oxygen and then gradually cooling to room temperature under pure oxygen. This procedure yielded a film composition of yttrium-barium-copper oxide with an atomic ratio of Y:Ba:Cu of 1:2:3 as determined by Rutherford backscattering spectroscopy and X-ray diffraction. The thickness of the film was determined to be about 1.5 microns ($\mu$m) by profilometry. The film was determined to have a homogeneous composition of Y-123 across the film by Rutherford Backscattering Spectroscopy and to be predominantly C-axis oriented by x-ray diffraction. Tc was measured to be 92 Kelvin (K), with $T_c = 0$ at 90K by resistivity and inductive techniques.

Although the present invention has been described with reference to specific details, it is not intended that such details should be regarded as limitations upon the scope of the invention, except as and to the extent that they are included in the accompanying claims.

What is claimed is:

1. A process of preparing a conformal film of a multicomponent metal oxide comprising the steps of:
    (a) forming an aerosol from a solution comprised of an organic solvent and at least two precursor compounds capable of volatilizing temperatures of said precursor compounds;
    (b) passing said aerosol in combination with an oxygen-containing carrier gas into a heated zone, said heated zone having a temperature sufficient to evaporate the organic solvent and volatilize said precursor compounds, said temperature is insufficient to decompose said precursor compounds; and (c) passing said volatilized precursor compounds in contact with a surface of a heated substrate, said substrate heated at temperatures greater than the temperature of the heated zone whereat said precursor compounds are volatilized and sufficient to decompose said volatilized precursor compounds whereby metal atoms contained within said volatilized precursor compounds are deposited as said multicomponent metal oxide film upon said surface of said substrate.

2. The process of claim 1 wherein the substrate is selected from the group consisting of silicon, magnesium oxide, yttrium-stabilized zirconium oxide, sapphire, lanthanum aluminate and lanthanum gallate.

3. The process of claim 1 wherein said solvent is selected from the group consisting of alcohols, ketones and aromatics, and said precursor compounds are a mixture of barium, yttrium and copper compounds having volatilities at temperatures lower than their respective decomposition temperatures.

4. The process of claim 3 wherein the molar ratios of the barium: copper: yttrium compounds in the solution are in the range of about 1.15–12.0 : 1.5–4.5 : 0.5–1.5.

5. A process of preparing a conformal film of a high temperature superconductive metal oxide comprising the steps of:

(a) forming an aerosol from a solution comprised of an organic solvent and precursor compounds selected from the group consisting of the respective metal acetates, the respective metal halides, and the respective metal diketonates, said precursor compounds capable of volatilizing at temperatures lower than the decomposition temperatures of said precursor compounds;

(b) passing said aerosol in combination with an oxygen-containing carrier gas into a heated zone, said heated zone having a temperature sufficient to evaporate the organic solvent and volatilize said precursor compounds, said temperature is insufficient to decompose said precursor compounds;

(c) passing said volatilized precursor compounds in contact with a surface of a heated substrate, said substrate heated at temperatures greater than the temperature of the heated zone whereat said precursor compounds are volatilized and sufficient to decompose said volatilized precursor compounds whereby metal atoms contained within said volatilized precursor compounds are deposited as a metal oxide film upon the substrate; and, (d) heating said deposited metal oxide film in an oxygen-containing atmosphere at temperatures sufficient to form said high temperature superconductive metal oxide film.

6. The process of claim 5 wherein said deposited metal oxide film is heated in an oxygen-containing atmosphere at temperatures from about 750° C. to about 950° C. for sufficient time to form said high temperature superconductive metal oxide film.

7. The process of claim 5 wherein said precursor compounds are a mixture of a barium compound, a copper compound, and a yttrium compound.

8. The process of claim 5 wherein the substrate is selected from the group consisting of silicon, magnesium oxide, yttrium-stabilized zirconium oxide, sapphire, lanthanum aluminate and lanthanum gallage.

9. The process of claim 5 wherein said solvent is selected from the group consisting of alcohols, ketones and aromatics, and said precursor a mixture of barium, yttrium and copper compounds having volatilities at temperatures lower than their respective decomposition temperatures.

10. The process of claim 9 wherein the molar ratios of the barium: copper: yttrium compounds in the solution are in the range of about 1.5–12.0 : 1.5–4.5 : 0.5–1.5.

* * * * *